US009003153B2

(12) United States Patent
Arya

(10) Patent No.: US 9,003,153 B2
(45) **Date of Patent: *Apr. 7, 2015**

(54) METHOD OF STORING BLOCKS OF DATA IN A PLURALITY OF MEMORY DEVICES IN A REDUNDANT MANNER, A MEMORY CONTROLLER AND A MEMORY SYSTEM

(75) Inventor: Siamak Arya, Cupertino, CA (US)

(73) Assignee: Greenliant LLC, Santa Clara, CA (US)

( * ) Notice: Subject to any disclaimer, the term of this patent is extended or adjusted under 35 U.S.C. 154(b) by 482 days.

This patent is subject to a terminal disclaimer.

(21) Appl. No.: 12/941,926

(22) Filed: Nov. 8, 2010

(65) Prior Publication Data

US 2012/0117444 A1 May 10, 2012

(51) Int. Cl.
*G06F 11/10* (2006.01)
*G06F 12/06* (2006.01)
*H03M 13/05* (2006.01)
*H03M 13/15* (2006.01)

(52) U.S. Cl.
CPC ......... *G06F 11/108* (2013.01); *H03M 13/1515* (2013.01); *G06F 2212/2022* (2013.01); *G06F 2212/7208* (2013.01); *G06F 2212/7201* (2013.01)

(58) Field of Classification Search
None
See application file for complete search history.

(56) References Cited

U.S. PATENT DOCUMENTS 6,480,943 B1 * 11/2002 Douglas et al. ............... 711/157
2002/0161972 A1 10/2002 Talagala et al.
2008/0250270 A1 * 10/2008 Bennett ............................ 714/6
2009/0006886 A1 1/2009 O'Connor et al.
2009/0150601 A1 6/2009 Conley
2009/0292712 A1 * 11/2009 Andersson et al. ........... 707/100
2010/0005228 A1 1/2010 Fukutomi et al.
2010/0070798 A1 3/2010 Cornwell et al.
2010/0172179 A1 7/2010 Gorobets et al.
2010/0257309 A1 10/2010 Barsky et al.
2010/0262773 A1 10/2010 Borchers et al.

FOREIGN PATENT DOCUMENTS

WO WO 2008 121306 A2 10/2008
WO WO2010/095612 8/2010

OTHER PUBLICATIONS

Munro, David S. "On the Integration of Concurrency, Distribution and Persistence." Department of Mathematical and Computational Sciences, University of St Andrews, Scotland, 1993.*
PCT International Search Report of PCT/US11/56572; dated Mar. 1, 2012.

(Continued)

*Primary Examiner* — Matthew Bradley
*Assistant Examiner* — Daniel Bernard
(74) *Attorney, Agent, or Firm* — DLA Piper LLP (US)

(57) ABSTRACT

A memory controller, system and method for storing data blocks in a plurality of physically distinct non-volatile memory devices, each being independently written to or read from. The method includes generating one or more error checking data blocks based upon the plurality of data blocks; and storing the plurality of data blocks and the error checking data block(s) in the distinct physical non-volatile memory devices, with each data block in a different physical memory device. The method links the addresses of the data blocks and the error checking data block(s) in a cyclical link so that any entry to one of the data blocks will result in a link to all of the other data blocks. The memory controller has a processor and a memory for storing programming code for performing the foregoing method.

30 Claims, 2 Drawing Sheets

| Logical address | Physical Address | RAID Group |
|---|---|---|
| Logical address a | Physical Addr. 1 | Group 1 |
| Logical address n | Physical Addr. 4 | Group 4 |
| Logical address m | Physical Addr. 15 | Group 5 |
| Logical address x | Physical Addr. 7 | Group 1 |
| Logical address p | Physical Addr. 23 | Group 7 |
| Logical address r | Physical Addr. 19 | Group 1 |
| Logical address q | Physical Addr. 3 | Group 1 |
| Parity Block | Physical Addr. A | Group 1 |

20a 20b 20c 20h
Device 1 Device 2 Device 3 •••• Device 8
10
Device 9
20i

(56) References Cited

OTHER PUBLICATIONS

PCT Written Opinion of the International Searching Authority of PCT/US11/56572; dated Mar. 1, 2012.
PCT International Search Report of PCT/US11/56571; dated Mar. 7, 2012.
PCT Written Opinion of the International Searching Authority of PCT/US11/56571; dated Mar. 7, 2012.
Japanese Office Action dated Apr. 3, 2014 corresponding to the related Japanese Patent Application No. 2013-538738. (English translation attached).
Communication and extended European Search Report as received from the European Patent Office dated Apr. 29, 2014 corresponding to the related European Patent Application No. 11839926.0.

* cited by examiner

METHOD OF STORING BLOCKS OF DATA IN A PLURALITY OF MEMORY DEVICES IN A REDUNDANT MANNER, A MEMORY CONTROLLER AND A MEMORY SYSTEM

TECHNICAL FIELD

The present invention relates to a method for storing redundantly and efficiently a plurality of blocks of data, and in particular where the blocks of data are random, among a plurality of independently read/writable non-volatile memory devices that have a block of data as the minimum amount of data that can be read from or written to the memory device. The method stores the plurality of blocks of data as well as one or more blocks of error checking data associated with the plurality of blocks of data, with each block of data stored in a separate non-volatile memory device, with an associated map linking the storage of blocks being created. The present invention also relates to a memory controller that executes the foregoing described method as well as a memory system with a memory controller that executes the method.

BACKGROUND OF THE INVENTION

Non-volatile memory devices that store or read a block of data at a time, such as a page of data, are well known in the art. For example, NAND memory devices typically can store a page, such as 4 kilobytes, of data in the device at each read/write operation. Other types of non-volatile memory devices that store or read a block of data at a time, include so called managed NAND memory devices, such as the NANDrive memory device available from Greenliant Systems, Inc. of Santa Clara Calif. In a managed NAND memory device, such as the NANDrive memory device, a controller controls the raw (or unmanaged) NAND memory device so that standard interface, such as SATA (serial ATA) can be used to interface with the NANDrive memory device. As used herein, the term “NAND memory device” shall refer to both raw as well as managed NAND memory devices.

In a NAND memory device, the non-volatile memory device can be written to or read from only in blocks of data at a time. Because of their ability to read back a block of data at a time, NAND memory devices are useful to store large amounts of data.

In the prior art, because NAND memory devices are subject to error, data has been stored in NAND memory devices along with error checking bits. Thus, one well known error checking bit that is generated from a plurality of data bits is a parity bit. Other types of error bits include Reed-Solomon error bits and other well known types. Data bits and error bits generated from the data bits are supplied to a plurality of NAND memory devices. One prior art method of storing a block of data bit is to break the block of data into a plurality of equal sub-blocks of data with each sub-block of data supplied to a physically distinct NAND memory device different from one another. The associated error bits (for the plurality of sub-blocks of data) are supplied to another physically distinct NAND memory device. Thus, all of the block of data bits and error bits are supplied to physically distinct NAND memory devices.

The sub-block of data that is supplied to each distinct NAND memory device can be stored in one of two ways. First, as the sub-block of data is received in the buffer of the NAND memory device, it is stored in a block of NAND memory cells for storage. This is wasteful because the block of storage contains only a sub-block amount of data. Alternatively, the sub-block of data can be kept in the buffer until another sub-block (from a different block of data) is received and so on, until an amount of data equal to a block is received in the buffer, in which case the entire block of data (comprising of many sub-blocks from different blocks of data) in the buffer can be stored in a block of storage. This alternative method is also not optimal because the data is kept in the buffer and there is the possibility of power failure causing loss of data, since the buffer is usually a volatile memory.

On read back, once a block of storage is read out from one of the NAND memory devices, the data read from the block of storage must be parsed to retrieve the selected sub-block of data. The plurality of sub-blocks of data associated with the select block (along with the associated error bits) are read out of the physically distinct NAND memory devices. The data from all of the data blocks are compared to the data from the error block to determine if an error occurred. In order for this method to operate correctly, in the prior art, a block of data is split into multiple sub-blocks and then with a block of error bits, reducing the size of data that is stored and read, which in turn reduces the read and write efficiency. For example, if a block of data is 4 kilobytes and is stored across 8 NAND devices. Each sub-block of data is 0.5 kilobytes and is stored in each block of a NAND device. On read-out, if 8 blocks of data or 32 kilobytes is desired, each of the eight (8) NAND devices has to be read eight times. The amount of data from each sub-block (0.5 kilobytes) from each of the eight (8) NAND devices has to assembled into a block of 4 kilobytes. However, the amount of time required to read a NAND device is due to the time required to set up the command operation, the time required to read the array of non-volatile memory cells, and the actual transfer time of 0.5 kilobytes form each NAND device. The amount of time to set up the command operation and the amount of time required to read the array are virtually the same, irrespective of the amount of data to be transferred. Since the block size of NAND devices is increasing, using the prior art method of splitting a block of data into sub-blocks and storing the sub-blocks in a block of a NAND device requires more time during the read operation.

Referring to FIG. 1 there is shown a schematic block diagram of a memory system 10 of the prior art and its attending problem in storing a plurality of blocks of data. FIG. 1 shows eight (8) blocks of data, having logical addresses of “logical address 1”, “logical address 2”, “logical address 3” etc. The memory system 10 also has eight NAND memory devices 20(*a-h*), shown as “Device 1”, “Device 2”, “Device 3” and “Device 8”, respectively, and a ninth NAND memory device 20*i* for storing, parity bits. A memory controller (not shown) controls the operation of the Devices 20(*a-h*) as well as the directing of the blocks of data into the various Devices 20(*a-h*), generating the parity bits and storing the parity bits in device 20*i*. In the prior art, when a block of data is received, such as the block of data having the logical address 1, the memory controller divides the block of data into eight sub-blocks and stores each sub-block into a different NAND device 20(*a-h*). Thus, as shown in FIG. 1, the block with logical address 1 and having a physical address A is divided into eight (8) sub-blocks with each sub-block stored in a different memory device 20(*a-h*). The memory controller generates a sub-block of parity bits based upon the eight sub-blocks of data from logical addresses 1 and stores the sub-block of parity bits into Device 9 20*i*. All of the eight (8) sub-blocks of data (nine including the sub-block of parity bits) from the data block with the logic address 1 are stored in a block of NAND device with a physical address A, albeit the blocks with physical address A are all in different memory NAND devices 20(*a-i*), but with the same physical address. A second block of data with logical address of 2 is stored in the same manner. The block of data is divided into eight (8) sub-blocks, but all with the physical address of B, and is stored in the NAND devices 20(*a-h*), with the associated parity bits to the eight (8) sub-blocks of data stored in the NAND device 20(*i*).

On read out, assume that the block having the logical address of logical address 3 is desired to be read, then the memory controller causes each of the NAND memory devices 20(*a-h*) to read the block of data at the physical addresses C associated with the logical address 3 from the non-volatile memory cells and into the respective buffer within each of the NAND memory devices 20(*a-h*). Thereafter, the data block having the logical address of logical address 3 is assembled based upon the eight sub-blocks of data read, and the data is compared to the parity bits from the device 20*i*, to ascertain whether there is any error. In addition, if any of the devices (a-h) detects an error, the block of parity bits associated with the data block having the logical address of 3 is read from the NAND memory device 20*i* and stored in its buffer. Then the error is corrected, and written back into the erroneous NAND memory device as well as having the corrected data supplied from the memory system 10. If there is no, error, the uncorrected data from the block having the logical address of logical address 3 is then supplied from the memory system 10.

As previously discussed, the problem with the storage of these blocks of data is that as NAND devices 20 increase in data transfer speeds and decrease in storage read latency, the read overhead dramatically reduces the performance of the storage system. This leads to increased overhead and time to read a large number of small blocks of data. Using the above as an example, if eight (8) blocks of data having logical addresses of (1-8) were desired to be read from the memory system 10, then from the foregoing discussion, it can be seen that each NAND device 20(*x*) must be read 8 times (even if we assume that all eight (8) memory devices 20(*a-h*)—including the NAND memory device 20(*i*)) for storing the parity bits) can be read simultaneously. Each of the eight (8) small block read operations, as discussed heretofore, requires the overhead time to set up the read operation, the time to read the array, and finally the time to transfer the data from the NAND device 20. That becomes more of a bottle neck, as NAND devices increase in array read latency and decrease in transfer time.

SUMMARY OF THE INVENTION

Accordingly, in the present invention, a method of storing a plurality of blocks of data in a plurality of physically distinct non-volatile memory devices is disclosed. Each physically distinct non-volatile memory device can be independently written to or read from, wherein each block of data is the minimum amount of data that can be written to or read from the non-volatile memory device. The method of the present invention comprises generating one or more blocks of error checking data based upon the plurality of blocks of data. The method further comprises storing the plurality of blocks of data and the one or more blocks of error checking data in the plurality of distinct physical non-volatile memory devices, with each block of data in a different physical memory device. Further, the plurality of blocks of data are linked in an address map.

The present invention also relates to a memory controller for controlling a plurality of independent memory devices. The memory controller has a processor and a non-volatile memory for storing programming code for execution by the processor in accordance with the foregoing described method.

Finally, the present invention relates to a memory system having a plurality of independent memory devices and the foregoing described memory controller for controlling the plurality of memory devices.

DETAILED DESCRIPTION OF THE INVENTION

Figure 1:
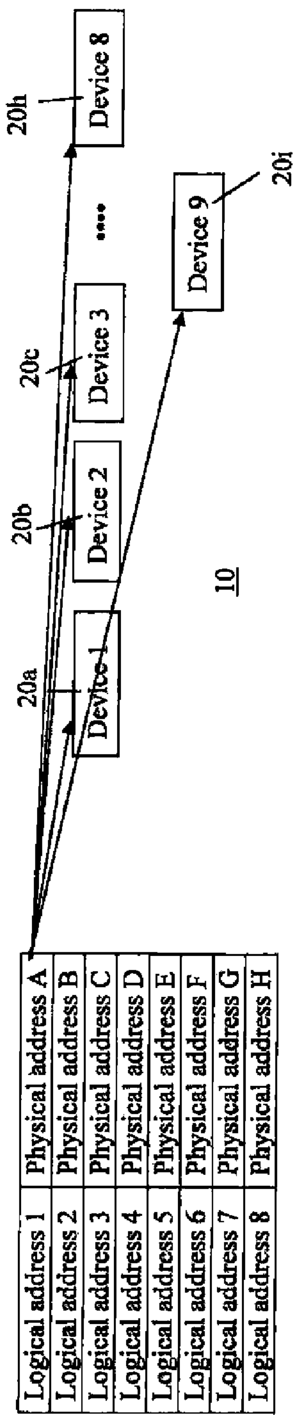
FIG. 1 is a black level diagram of a memory system operated in accordance with the method of the prior art.
Figure 2:
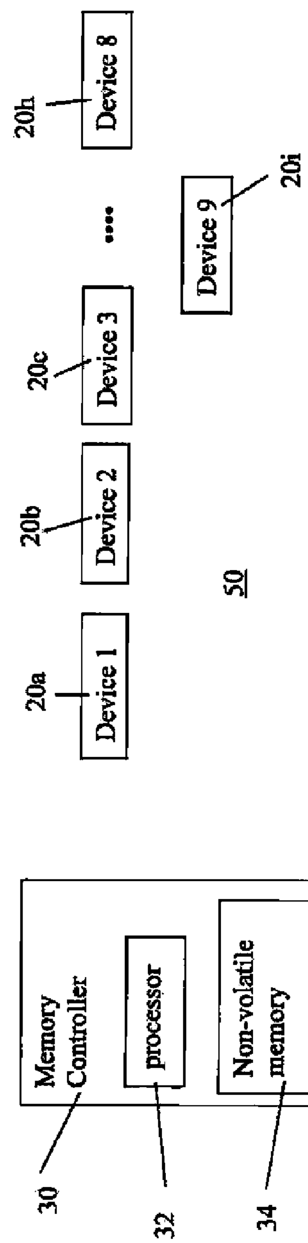
FIG. 2 is a schematic block diagram of a memory controller and a memory system for operating the method of the present invention.

Referring to FIG. 2 there is shown a memory system 50 of the present invention. In the memory system 50 of the present invention, a memory controller 30 controls a plurality of NAND memory devices 20(*a-i*), which can be the same as the NAND memory devices of the prior art shown in FIG. 10. The memory controller 30 comprises a processor 32 and a non-volatile memory, typically NOR memory, for storing programming code to be executed by the processor 32. The programming code stored in the NOR memory 34 causes the processor 32 to operate the method of the present invention in controlling the storage of a plurality of blocks of data to be stored in the plurality of NAND memory devices 20(*a-i*). The memory controller 30 can be an integrated circuit device containing both the processor 32 and non-volatile memory 34 containing the programming code for execution by the processor 32.

Figure 3:
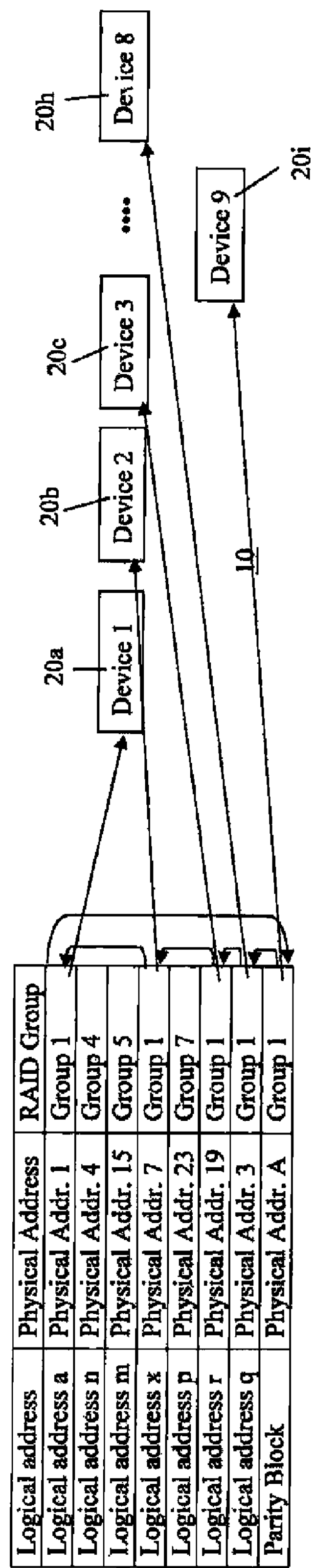
FIG. 3 is a diagram of a mapping table for implementing the preferred embodiment of the method of the present invention.

Referring to FIG. 3 there is shown a table of mapping addresses maintained by the memory controller 30 in the method of the present invention. Each block of data received by the memory system 50 has an associated logical address. As each block of data is received by the memory system 50, the memory controller 30 assigns a physical address to be associated with the logical address. Thus, for example, for the first block of data, having the logical address of "a", the memory controller 30 assigns a physical address of "1" to that block of data. In addition, that logical address a is assigned a RAID group of "1". As another block of data is received, e.g. block of data having a logic address of "x", it is assigned a physical address of "7". The RAID Group assigned to that block is also "1". As blocks with logical address of "r" and "q" are received they are assigned the physical address of "19" and "3" respectively, and are also assigned the RAID Group of "1". The data from the blocks at the logical addresses of "a", "x", "r" and "q" are then used to generate a block of error correcting bits, such as parity bits, and collectively, these blocks are then written into the physical NAND devices 20(*a-i*) with one block of data (including a block of error bits) into a different device 20 (*a-i*). The parity block of data is written into the physical address A, which is an address in the Device 20*i*, and it is also assigned a RAID Group of "1". The parameters for grouping the blocks of data within the same RAID Group can be based upon a number of factors, such as the physical address (or the logical address) of the blocks of data in the same RAID Group all refer to a different NAND memory device 20. Thus, the physical addresses of 1, 7, 19, 3 and A, refer to addresses within each of the NAND memory devices 20(*a-i*). Each block of data (or error checking data) has its address (logical address or physical address) linked to all of the other blocks of data in the same RAID group. Further, the link is cyclical in that from any entry into the address map table, all of the other blocks of data (or error checking data) can be located. By cyclical it is meant that even if one link is broken, all of the entries can still be determined. For example, if it is desired to access the block of data having a logical address of x, (with the corresponding physical address of 7), the method of the present invention provides a link to the block having a logical address a (corresponding physical address 1). From logical address a, the logical addresses (and corresponding physical addresses) of other blocks can be determined. However, if that aforementioned link were broken, then from logical address x (and physical address 7) the block with logical address r (and physical address 19) an be found and from there the rest of the logical addresses (and corresponding physical addresses) can be found. Thus, the block of data having the logical address of x, automatically points to another block of data in the same RAID group having a logical address a etc. Of course, as indicated earlier, the linking can also be by the physical address.

On read back from the memory system 50, let us assume that the block of data having the logical address of x is desired to be retrieved. The memory controller 30 refers to the mapping table shown in FIG. 3 and determines the device and physical address the block must be read from, and reads the block of data more efficiently because of the larger size of the read block. If an error occurs during the read operation, then the memory controller 30 determines that a read operation should be initiated for all of the Devices 20(*a-i*), except for the erroneous device, at the physical addresses of 1, 7, 19, 3, and A—which all refer to different Devices 20(*a-i*). The devices 20(*a-i*) all perform their respective read operation independently of one another and the data from the non-volatile memory cells at those respective physical addresses are read and then stored in the buffer of that memory device 20(*a-i*). The parity bits from the memory device 20*i* at the physical address A is then used to determine whether there is an error in the data from the block at the physical address 7, which is the block having the logical address of x. If there is no error, the data from the logical block x is then supplied from the memory system 50, since that was the block of data requested. If there is an error, but not in the block having the logical address x, the data from the logical address x is supplied from the memory system 50. In addition, the buffer in the memory device 20 that contains the error is then corrected. That memory device 20 is then instructed to write back the corrected data in its buffer into the non-volatile memory cell array of the device 20. The mapping table of FIG. 3 is then updated with the physical address of the corrected data in the device 20. If there is an error, in the block having the logical address x, the data from the logical address x is corrected and then the corrected data is supplied from the memory system 50. In addition, the buffer in the memory device 20 for the logical address x is then corrected. That memory device 20 is then instructed to write back the corrected data in its buffer into the non-volatile memory cell array of the device 20. The mapping table of FIG. 3 is then updated with the physical address of the corrected data in the device 20.

From the foregoing, it can be seen that there are a number of advantages to the present invention. In particular, with the blocks of independently received data grouped into a RAID group and one or more error checking bits formed therefrom, and with the blocks of data and error checking data stored in the memory devices 20, with one block in each different memory device, the RAID concept is continued, resulting in more accurate data readout. Moreover, more efficient readout of the NAND memory devices is possible, especially as NAND memory devices continue to increase in storage capacity, along with greater error detection and correction, because a single read operation results in an entire block of data being read, rather than a sub-block of data as in the prior art.

What is claimed is:

1. A method of storing a plurality of data blocks in a plurality of physically distinct non-volatile memory devices, each being independently written to or read from, wherein each of the data blocks has a logical address different from that of the others of the data blocks, and wherein at least one of the data blocks has a logical address that is outside of a sequential order of the logical addresses of the others of the data blocks, said method comprising:

generating one or more error checking data blocks based upon said plurality of data blocks;

storing said plurality of data blocks and said one or more error checking data blocks in said plurality of physically distinct non-volatile memory devices, with each of the data blocks in a different one of the physically distinct non-volatile memory devices; and linking said plurality of data blocks and said one or more error checking data blocks in an address map.

2. The method of claim 1 wherein said generating step comprises generating one or more parity data blocks based upon said plurality of data blocks.

3. The method of claim 1 wherein each data block is the minimum amount of data that can be written to or read from each of the non-volatile memory devices.

4. The method of claim 1 wherein said linking further comprises associating addresses of said plurality of data blocks and said one or more error checking data blocks with one another by a cyclical link by which any entry in the address map for one of the data blocks will result in a link to all of the other data blocks.

5. The method of claim 4 wherein said associated addresses include said logical addresses.

6. The method of claim 4 wherein said associated addresses are physical addresses.

7. A memory controller for controlling the storage of a plurality of data blocks in a plurality of physically distinct non-volatile memory devices, each non-volatile memory device being independently written to or read from, wherein each of the data blocks has a logical address different from that of the others of the data blocks, and wherein at least one of the data blocks has a logical address that is outside of a sequential order of the logical addresses of the others of the data blocks, said memory controller comprising:

a processor; and a memory storing programming code for execution by said processor, said programming code for generating one or more error checking data blocks based upon said plurality of data blocks; and for storing said plurality of data blocks and said one or more error checking data blocks in said plurality of physically distinct memory devices, with each of the data blocks in a different one of the physically distinct memory devices, and for linking said plurality of data blocks and said one or more error checking data blocks in an address map.

8. The memory controller of claim 7 wherein said generating of said one or more error checking data blocks includes generating one or more parity data blocks based upon said plurality of data blocks.

9. The memory controller of claim 7 wherein said processor and said memory are formed in an integrated circuit device.

10. The memory controller of claim 7 wherein each data block is the minimum amount of data that can be written to or read from each of the non-volatile memory devices.

11. The memory controller of claim 7 wherein the linking includes generating cyclical links by which any entry to one of the data blocks will result in a link to all of the other data blocks.

12. The memory controller of claim 11 wherein said cyclical links link the logical addresses of the data blocks.

13. The memory controller of claim 11 wherein said cyclical links link physical addresses of the data blocks.

14. A memory controller for controlling the storage of a plurality of data blocks in a plurality of physically distinct non-volatile memory devices, each non-volatile memory device being independently written to or read from, wherein each of the data blocks has a logical address different from that of the others of the data blocks, said memory controller comprising:

a processor; and a memory storing programming code for execution by said processor, said programming code for generating one or more error checking data blocks based upon said plurality of data blocks; and for storing said plurality of data blocks and said one or more error checking data blocks in said plurality of physically distinct memory devices, with each of the data blocks in a different one of the physically distinct memory devices, and for linking said plurality of data blocks and said one or more error checking data blocks in an address map;

wherein said programming code for execution by said processor further comprises programming code for causing said processor to read one of the data blocks from one of the non-volatile memory devices at a desired address, otherwise to read others of the data blocks having addresses associated with the desired address; and construct the one data block pertaining to the desired address.

15. The method of claim 14, wherein said step of reading others of the data blocks is performed only if the step of reading the one data block from one of the non-volatile memory devices at said desired address results in an error.

16. A memory system comprising:

a plurality of physically distinct non-volatile memory devices, wherein each physically distinct non-volatile memory device is capable of being independently written to or read from;

a controller for controlling the storage of a plurality of data blocks in said plurality of non-volatile memory devices wherein each of the data blocks has a logical address different from the others of the data blocks, and wherein at least one of the data blocks has a logical address that is outside of a sequential order of the logical addresses of the others of the data blocks, said controller comprising:

a processor; and a memory storing programming code for execution by said processor, said programming code for generating one or more error checking data blocks based upon said plurality of data blocks; and for storing said plurality of data blocks and said one or more error checking data blocks in said plurality of physically distinct memory devices, with each of the data blocks in a different one of the physically distinct memory devices, and for linking said plurality of data blocks and said one or more error checking data blocks in an address map.

17. The memory system of claim 16 wherein each data block is the minimum amount of data that can be written to or read from each of the non-volatile memory devices.

18. The memory system of claim 16 wherein said generating of said one or more error checking data blocks includes generating one or more parity data blocks based upon said plurality of data blocks.

19. The memory system of claim 16 wherein said processor and said memory are formed in an integrated circuit device.

20. The memory system of claim 16 wherein said linking includes generating cyclical links by which any entry to one of the data blocks will result in a link to all of the other data blocks.

21. The memory system of claim 20 wherein said cyclical links link the logical addresses of the data blocks.

22. The memory system of claim 20 wherein said cyclical links link physical addresses of the data blocks.

23. A memory system comprising:

a plurality of physically distinct non-volatile memory devices, wherein each physically distinct non-volatile memory device is capable of being independently written to or read from;

a controller for controlling the storage of a plurality of data blocks in said plurality of non-volatile memory devices wherein each of the data blocks has a logical address different from the others of the data blocks, said controller comprising:

a processor; and a memory storing programming code for execution by said processor, said programming code for generating one or more error checking data blocks based upon said plurality of data blocks; and for storing said plurality of data blocks and said one or more error checking data blocks in said plurality of physically distinct memory devices, with each of the data blocks in a different one of the physically distinct memory devices, and for linking said plurality of data blocks and said one or more error checking data blocks in an address map;

wherein said programming code for execution by said processor further comprises programming code for causing said processor to read one of the data blocks from one of the non-volatile memory devices at a desired address, otherwise to read others of the data blocks having addresses associated with the desired address and constructing the one data block pertaining to the desired address.

24. The method of claim 23, wherein said step of reading others of the data blocks is performed only if the step of reading the one data block from one of the non-volatile memory devices at said desired address results in an error.

25. A method of operating a memory system having a plurality of physically distinct non-volatile memory devices, wherein each non-volatile memory device is capable of being independently written to or read from; and a controller for controlling the storage of a plurality of data blocks in said plurality of non-volatile memory devices where each of the data blocks has a logical address different from that of the others of the data blocks, said method comprising:

writing to said memory system by:

generating one or more error checking data blocks based upon said plurality of data blocks;

associating addresses of said plurality of data blocks and said one or more error checking data blocks with one another;

storing said plurality of data blocks and said one or more error checking data blocks in said plurality of physically distinct non-volatile memory devices, with each of the data blocks in a different one of the physically distinct non-volatile memory devices;

reading from said memory system at a desired address by:

reading one of the data blocks from one of the non-volatile memory devices having said desired address, otherwise reading others of the data blocks having addresses associated with said desired address and constructing the one data block pertaining to the desired address.

26. The method of claim 25 wherein said generating step comprises generating one or more parity data blocks based upon said plurality of data blocks.

27. The method of claim 25 wherein said associating step associates the logical addresses of said plurality of data blocks with one another.

28. The method of claim 25 wherein said associating step associates physical addresses of said plurality of data blocks with one another.

29. The method of claim 25 wherein said step of reading others of the data blocks is performed only if the step of reading the data block from a non-volatile memory device having said desired address results in an error.

30. The method of claim 25 wherein each data block is the minimum amount of data that can be written to or read from each of the non-volatile memory devices.

* * * * *